(12) United States Patent
Hsu

(10) Patent No.: US 7,923,714 B2
(45) Date of Patent: Apr. 12, 2011

(54) PHASE CHANGE MEMORY CELL STRUCTURES AND METHODS FOR MANUFACTURING THE SAME

(75) Inventor: Hong-Hui Hsu, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 404 days.

(21) Appl. No.: 12/106,822

(22) Filed: Apr. 21, 2008

(65) Prior Publication Data

US 2008/0296552 A1 Dec. 4, 2008

(30) Foreign Application Priority Data

May 31, 2007 (TW) .................. 96119444 A

(51) Int. Cl.
*H01L 47/00* (2006.01)
(52) U.S. Cl. ................... 257/4; 257/2; 257/E45.002
(58) Field of Classification Search .................. None
See application file for complete search history.

(56) References Cited

U.S. PATENT DOCUMENTS

| | | | | |
|---|---|---|---|---|
| 5,789,758 | A * | 8/1998 | Reinberg ........................ | 257/3 |
| 7,259,040 | B2 * | 8/2007 | Pellizer et al. .............. | 438/102 |
| 7,397,092 | B2 * | 7/2008 | Horii et al. .................. | 257/379 |
| 7,589,342 | B2 * | 9/2009 | Chang ............................ | 257/3 |
| 7,750,431 | B2 * | 7/2010 | Hideki ........................ | 257/529 |
| 2006/0034116 | A1 * | 2/2006 | Lam et al. .................... | 365/151 |
| 2007/0241319 | A1 * | 10/2007 | Chang .............................. | 257/3 |
| 2009/0218567 | A1 * | 9/2009 | Mathew et al. ................. | 257/52 |
| 2010/0163828 | A1 * | 7/2010 | Tu .................................. | 257/3 |

FOREIGN PATENT DOCUMENTS

CN 1714405 A 12/2005

OTHER PUBLICATIONS

Dae-Hwan Kang et al., "One-Dimensional Heat Conduction Model for an Electrical Phase Change Random Access Memory Device with an $8F^2$ Memory Cell (F=0.15um)," Journal of Applied Physics, vol. 94, No. 5, Sep. 1, 2003, p. 3536-3542, American Institute of Physics, US.

* cited by examiner

Primary Examiner — Jarrett J Stark

(57) ABSTRACT

Phase change memory cell structures and methods for fabricating the same are provided. An exemplary embodiment of a phase change memory cell structure includes a first electrode formed over a first dielectric layer. A second dielectric layer is formed over the first electrode. A conductive member is formed through the second dielectric layer and electrically contacting the first electrode, wherein the conductive member comprises a lower element and an upper element sequentially stacking over the first electrode, and the lower and upper elements comprises different materials. A phase change material layer is formed over the second dielectric layer, electrically contacting the conductive member. A second electrode is formed over the phase change material layer.

9 Claims, 5 Drawing Sheets

PHASE CHANGE MEMORY CELL STRUCTURES AND METHODS FOR MANUFACTURING THE SAME

BACKGROUND

The invention relates to memory devices, and more particularly to a phase change memory (PCM) cell structure and a method for fabricating the same.

Phase change memory devices are non-volatile, highly readable, highly programmable, and require a relatively lower driving voltage/current. Current trends in phase change memory development are to increase cell density and reduce current density thereof.

Phase change material in a phase change memory devices have at least two solid phases, a crystalline state and an amorphous state. Transformation between these two phases can be achieved by changing the temperature of the phase change material. The phase change material exhibits different electrical characteristics depending on its state. For example, in its amorphous state the material exhibits a higher resistivity than in the crystalline state. Such phase change material may switch between numerous electrically detectable conditions of varying resistivities within a nanosecond time scale with the input of pico joules of energy. Chalcogenide material is a popular and widely used phase change material in modern phase change memory technology.

Since phase change material permits reversible phase transformation, memory bit status can be distinguished by determining the phase of phase change material in the memory bit.

FIG. 1 is a schematic diagram of a cross section of a conventional phase change memory cell structure, in which the phase change memory cell structure includes an isolation structure 13 is located at a predetermined region of a semiconductor substrate 11 to thereby define an active region. A source region 17s and a drain region 17d are also disposed apart in the active region. A gate 15, functioning as a word line, is disposed across the active region between the source region 17s and the drain region 17d. The gate 15, the source region 17s and the drain region 17d form a transistor. The semiconductor substrate 11 having the transistor thereon is covered with an insulating layer 19. An interconnection line 21 is disposed over the first insulating layer 19. The interconnection line 21 is electrically connected to the drain region 17d through a contact hole penetrating the first insulating layer 19. Another insulating layer 23 covers the interconnection line 21. A heating plug 25 is disposed in the insulating layers 19 and 23, electrically connecting the source region 17s. A patterned phase change material layer 27 and a top electrode 29 are sequentially stacked over the insulating layer 23, wherein a bottom surface of the phase change material layer pattern 27 is in contact with the heating plug 25. Another insulating layer 31 is disposed on the insulating layer 23. A bit line 33 is disposed on the insulating layer 31 and is in contact with the top electrode 29.

In a write mode, the transistor is turned on and a large current flows through the heating plug 25, thus heating up an interface between the phase change material layer pattern 27 and the heating plug 25, thereby transforming a portion 27a of the phase change material layer 27 into either the amorphous state or the crystalline state depending on the length of time and amount of current that flows through the heating plug 25.

One problem is found with conventional phase change devices, is the relatively large amount of current required to successfully change the state of the phase change material during a write operation. One solution to increasing current density is to reduce a diameter D of the heating plug 25. An aspect ratio of an opening (not shown) for disposing the heating plug 25 formed through the insulating layers 23 and 19 increases when the diameter D of the heating plug 25 is reduced. Since the heating plug 25 is typically formed by processes such as physical vapor deposition (PVD) or chemical vapor deposition (CVD), heating plug 25 may be thus form with undesired structures such as seams or voids therein as long as increase of the aspect ratio of the opening for disposing thereof and may thereby degrade reliability thereof. Therefore, reliability of a phase change material memory cell structure with such heating plugs is affected and size reduction thereof is problematic.

SUMMARY

A phase change memory cell structure and a method for fabricating the same are provided.

An exemplary embodiment of a phase change memory cell structure comprises a first electrode formed over a first dielectric layer. A second dielectric layer is formed over the first electrode. A conductive member is formed through the second dielectric layer and electrically contacting the first electrode, wherein the conductive member comprises a lower element and an upper element sequentially stacking over the first electrode, and the lower and upper elements comprises different materials. A phase change material layer is formed over the second dielectric layer, electrically contacting the conductive member. A second electrode is formed over the phase change material layer.

An exemplary embodiment of a method for fabricating a phase change memory cell structure comprises providing a first dielectric layer with a first electrode formed thereon. A second dielectric layer is formed over the first dielectric layer. An opening is formed in the second dielectric layer, wherein the opening passes through the second dielectric layer, exposes a portion of the first electrode, and has a first aspect ratio. A selective deposition process is performed to merely fill a first conductive layer in the opening, wherein the first conductive layer is formed over the portion of the first electrode exposed by the opening and reduces the first aspect ratio of the opening to a second aspect ratio. A film deposition process is performed to blanketly deposit conductive materials over the second dielectric layer and in the opening. A planarization process is performed to remove the conductive material above the second dielectric layer, leaving a second conductive layer in the opening, wherein the second conductive layer stacks over the first conductive layer. A phase change material layer is formed over the second dielectric layer to electrically connect the second conductive layer. A second electrode is formed over the phase change material layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-6 are schematic diagrams showing cross sections at different stages during fabrication of a phase change memory cell structure according to an exemplary embodiment.

Figure 1:
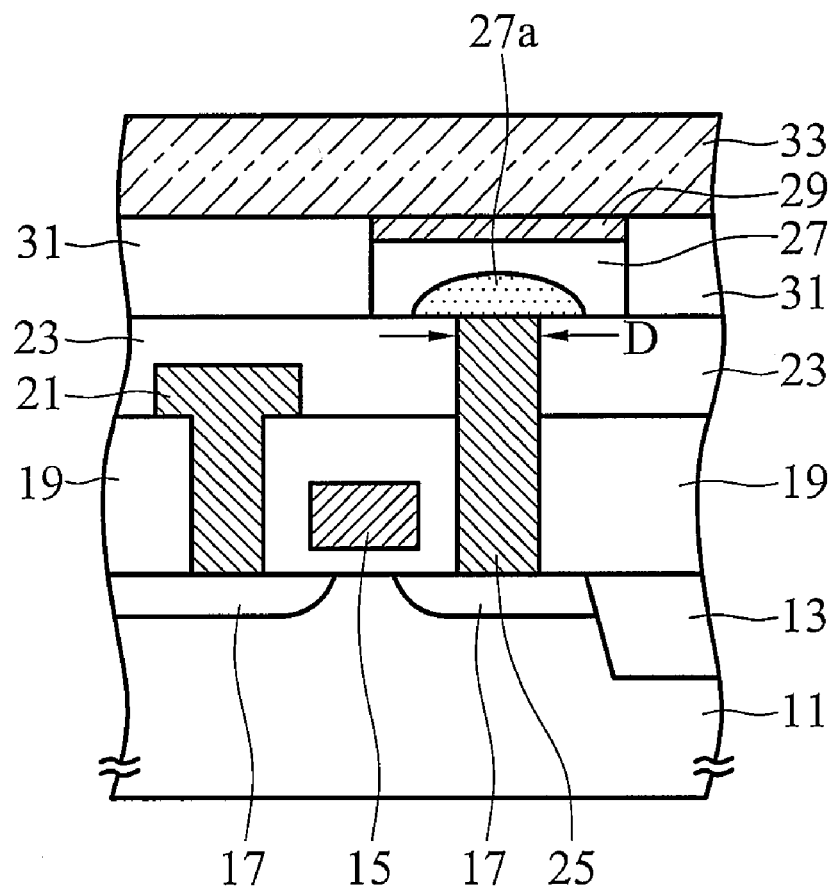
FIG. 1 is a schematic diagram showing a cross section of a conventional phase change memory cell structure.
Figure 2:
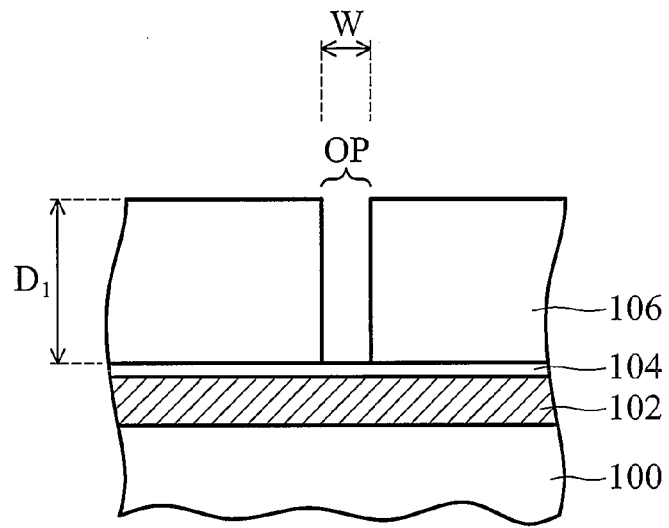
FIGS. 2-6 are diagrams showing cross sections at different stages during fabrication of a phase change memory cell structure according to an embodiment of the invention, respectively.

In FIG. 2, a substantially fabricated structure is first provided, including a first electrode 102 formed over a dielectric layer 100, and a catalyst layer 104 and a dielectric layer 106 are then formed over the first electrode. As shown in FIG. 2, although the dielectric layer 100 is illustrated as a plane dielectric layer here, it may include proper conductive members (e.g. interconnecting plugs or interconnecting lines) for electrically connecting a sequentially formed memory cell structure with an underlying active device (e.g. transistors or diodes) or a conductive line. For simplicity, these conductive members and/or devices are not illustrated in the FIG. 2.

As shown in FIG. 2, an opening OP is then formed in the dielectric layer 106 and downward through thereof, partially exposing a portion of the underlying catalyst layer 104. Herein, the opening OP is formed with a width W and a depth $D_1$, having an aspect ratio ($D_1$:W) of about 2:1~4.5:1. Herein, the first electrode 102 may comprise conductive materials such as W, Ti, TaN, Ta, polysilicon, Al or AlCu and the catalyst layer 104 may comprise conductive materials such as Pd, Co, or Cu. The catalyst layer 104 is formed with a thickness of about 30-100 Å for allowing catalyzing a sequential selective deposition.

Figure 3:
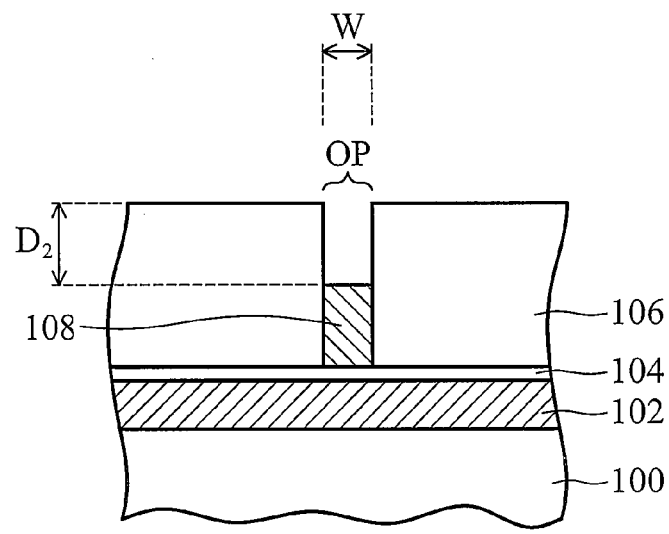

In FIG. 3, a selective deposition process (not shown), for example an electroless plating process, is then performed to fill the opening OP with conductive materials, thereby forming a conductive layer 108 in the opening OP. Herein, the conductive layer 108 merely partially fills a bottom portion of the opening OP and electrically connects with the first electrode 102 through the catalyst layer 104. As shown in FIG. 3, after formation of the conductive layer 108, the opening OP is then formed with a reduced depth $D_2$ and an aspect ratio ($D_2$:W) thereof is now reduced to about 1:1~2.25:2. Herein, the catalyst layer 104 has the ability to catalyst the selective deposition process such as an electroless plating process.

As shown in FIG. 3, while the conductive layer 108 is formed by an electroless plating process, a substrate or a wafer with the structure illustrated in FIG. 3 is immersed in a wet chemical bath (not shown) for providing a wet film deposition process according to oxidation and/or reduction reactions, thereby selectivity forming the conductive layer 108 on the exposed portion of the catalyst layer 104. Compared with a conventional atomic layer deposition (ALD) film deposition process, the electroless plating process provides faster film deposition rate and better gap filling ability. In addition, the electroless plating process also shows great deposition results through a time mode control. Therefore, the conductive layer 108 is formed by an increased deposition rate relative to an ALD technique. The conductive layer 108 may comprises trinary conductive materials such as CoWP or CoWB.

Figure 4:
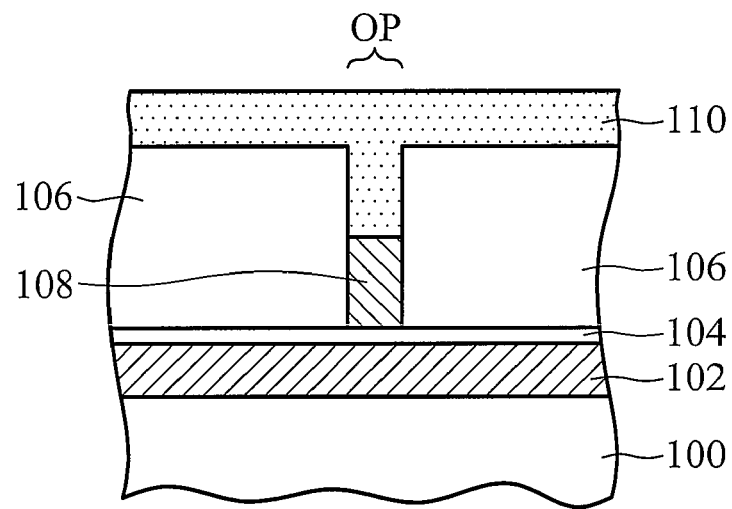

In FIG. 4, a film deposition process (not shown) such as chemical vapor deposition (CVD) process or physical vapor deposition (PVD) process, is next performed to blanketly form a conductive material 110 over the dielectric layer 106. The conductive material 110 also fills remaining portions of the opening OP. Since the opening OP is previously formed with the conductive layer 108 at the bottom portion thereof to reduce an aspect ratio thereof, therefore the conductive material 110 can be formed with a better deposition quality during the above film deposition process, thereby reducing undesired structures such as seams or voids formed in the opening OP. Herein, the conductive material 110 may be conductive materials such as TiN or TaN and may not only function as a part of a conductive member but also as a barrier layer against materials in the conductive layer 108 from diffusing into adjacent elements (i.e. the phase change material layer 112).

Figure 5:
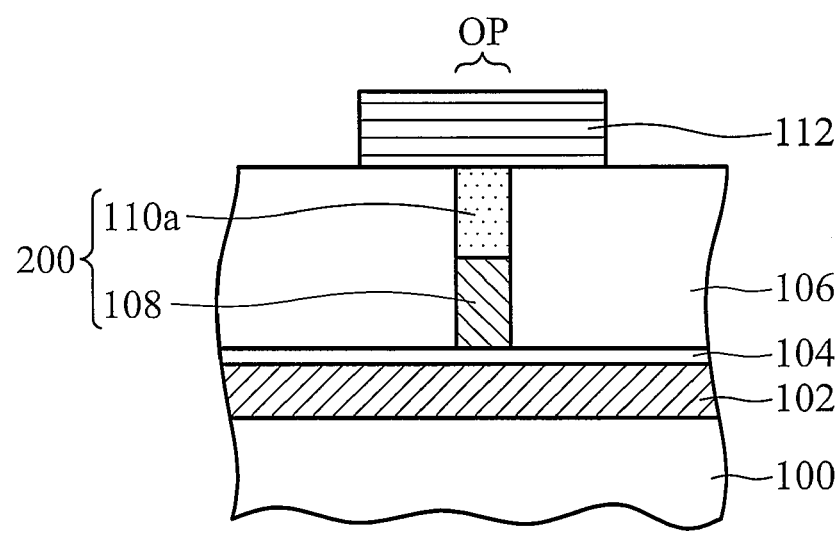

In FIG. 5, a planarization process (not shown), for example a chemical mechanical polishing (CMP) process, is next performed to remove the portion of the conductive material 110 above the dielectric layer 106, thereby forming another conductive layer 110a stacking over the conductive layer 108 in the opening OP. The conductive layer 110a and the conductive layer 108 forms a conductive member 200 and have a height ratio of about 2:1~4.5:1 therebetween. Herein, the conductive member 200 is substantially coplanar with the dielectric layer 106. Next, a patterned phase change material layer 112 is formed over the dielectric layer 106. Herein, the phase change material layer 112 may comprises chalcogenide materials such as Ge—Te—Sb trinary chalcogenide compound or Te—Sb binary chalcogenide compounds and can be formed by methods such as CVD or sputtering. The phase change material layer 112 now covers the conductive layer 110a and portions of the dielectric layer 106, thereby forming an electrical connection with the first electrode 102 through the conductive member 200.

Figure 6:
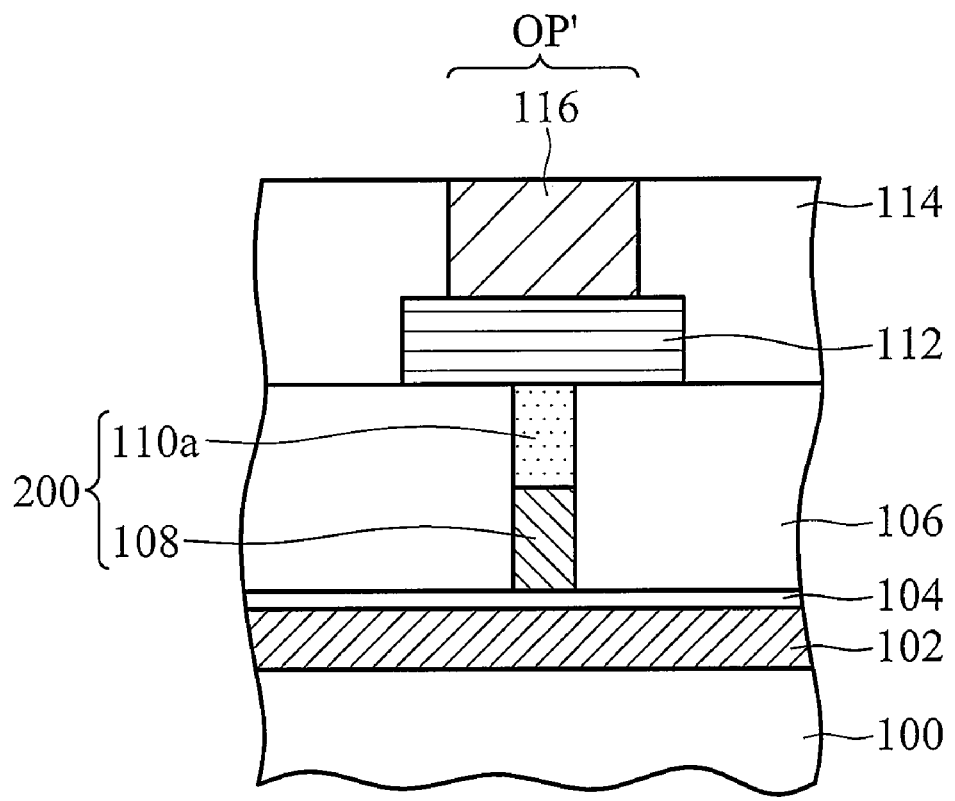

In FIG. 6, a dielectric layer 114 is then blanketly formed over the dielectric layer 106 and covers the phase change material layer 112. An opening OP' is next formed in the dielectric layer 106 to expose a portion of the phase change material layer 112. The opening OP' is next filled with conductive materials such as W, Ti, Al or Cu, thereby forming a conductive layer 116 therein and an exemplary phase change memory cell structure is substantially fabricated.

As shown in FIG. 6, an exemplary phase change memory cell structure is illustrated, wherein the conductive member 200 therein may function as a heating electrode for heating the phase change material layer 112. The conductive member 200 is disposed in an opening having an increased aspect ratio (greater than 2:1) formed within the dielectric layer 106 and includes two sub-elements, thereby improving structure of a conductive member formed in an opening with high aspect ratio and preventing undesired structures such as seams or voids formed therein. Thus, the conductive member 200 illustrated in FIG. 6 is desired in the phase change memory device with reduced feature sizes.

Figure 7:
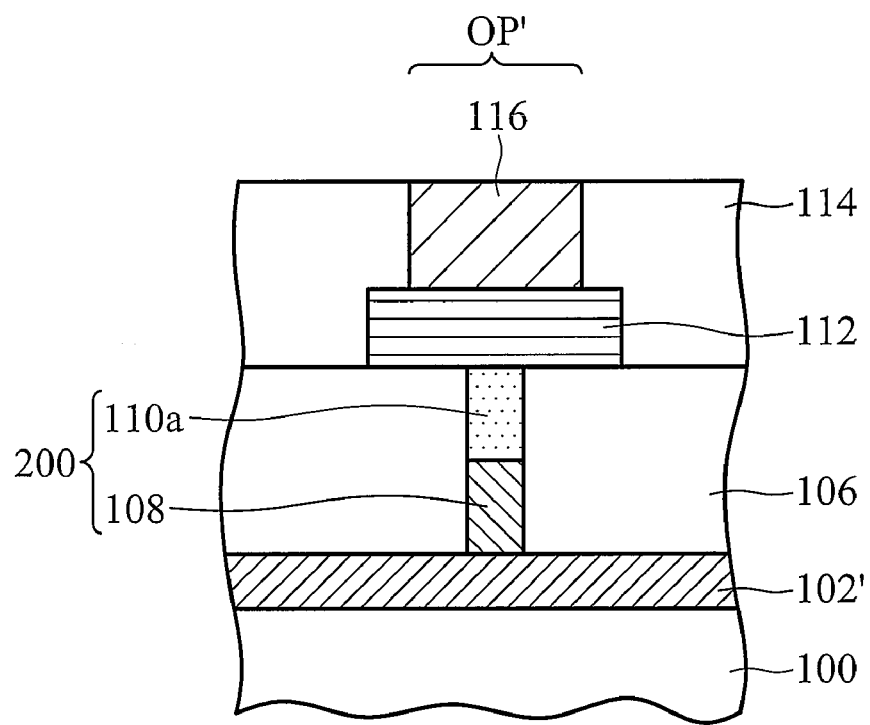
FIG. 7 is a schematic diagram showing a phase change memory cell structure according to another embodiment of the invention.

In FIG. 7, another exemplary phase change memory cell structure is illustrated. Herein, the memory cell structure illustrated in FIG. 7 is substantially similar with that illustrated in FIG. 6 and same titles represent same elements and functions. Only differences therebetween are discussed as follows.

In FIG. 7, a first electrode 102' of copper material is adopted and the catalyst layer 104 illustrated in FIG. 6 is omitted based on oxidation/reduction reaction theory. Fabrication of the dielectric layer 106, the conductive member 200 and other elements can be similar with those illustrated through FIGS. 1-6 to thereby provide the memory cell structure as illustrated in FIG. 7. Herein the conductive member

200 directly electrically connects the first electrode 102' and heats the phase change material layer 112.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory cell structure, comprising:
   a first electrode formed over a first dielectric layer;
   a second dielectric layer formed over the first electrode;
   a conductive member formed through the second dielectric layer and electrically contacting the first electrode, wherein the conductive member comprises a lower element and an upper element sequentially stacking over the first electrode, and the lower and upper elements comprises different materials, wherein the lower element comprises CoWP or CoWB;
   a phase change material layer formed over the second dielectric layer, electrically contacting the conductive member; and
   a second electrode formed over the phase change material layer.

2. The phase change memory cell structure as claimed in claim 1, wherein the lower element and the upper element have a height ratio of about 2:1~4.5:1 therebetween.

3. The phase change memory cell structure as claimed in claim 1, wherein the upper element comprises TiN or TaN.

4. The phase change memory cell structure as claimed in claim 1, wherein the phase change material layer comprises chalcogenide materials.

5. The phase change memory cell structure as claimed in claim 1, wherein the first electrode comprises copper.

6. The phase change memory cell structure as claimed in claim 1, further comprising a catalyst layer formed between the first electrode and the conductive member, wherein the conductive member electrically connects the first electrode by the catalyst layer.

7. The phase change memory cell structure as claimed in claim 6, wherein the catalyst layer comprises Pd, Co or Cu.

8. The phase change memory cell structure as claimed in claim 6, wherein the catalyst layer has a thickness of about 30~100 Å.

9. The phase change memory cell structure as claimed in claim 7, wherein the first electrode comprises W, Ti, TiN, Ta, TaN, polysilicon, Al or AlCu.

* * * * *